(12) United States Patent
Kimura et al.

(10) Patent No.: US 10,029,462 B2
(45) Date of Patent: Jul. 24, 2018

(54) PIEZOELECTRIC DEVICE, MEMS DEVICE, LIQUID EJECTING HEAD, AND LIQUID EJECTING APPARATUS

(71) Applicant: Seiko Epson Corporation, Tokyo (JP)

(72) Inventors: Satoshi Kimura, Fujimi (JP); Hitoshi Matsumoto, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/443,268

(22) Filed: Feb. 27, 2017

(65) Prior Publication Data

US 2017/0253039 A1    Sep. 7, 2017

(30) Foreign Application Priority Data

Mar. 2, 2016 (JP) ................. 2016-039699

(51) Int. Cl.
| | |
|---|---|
| *B41J 2/14* | (2006.01) |
| *H01L 41/04* | (2006.01) |
| *H01L 41/083* | (2006.01) |
| *B41J 2/16* | (2006.01) |

(52) U.S. Cl.
CPC ......... *B41J 2/14233* (2013.01); *B41J 2/161* (2013.01); *H01L 41/04* (2013.01); *H01L 41/083* (2013.01); *B41J 2002/14241* (2013.01)

(58) Field of Classification Search
CPC ............... B41J 2/14233; B41J 2/161; B41J 2002/14241; H01L 41/083; H01L 41/04
See application file for complete search history.

(56) References Cited

U.S. PATENT DOCUMENTS

| | | | |
|---|---|---|---|
| 2005/0275693 A1 | 12/2005 | Murata et al. | |
| 2010/0097431 A1* | 4/2010 | Takakuwa | B41J 2/14233 347/68 |
| 2014/0267504 A1 | 9/2014 | Ohashi et al. | |

FOREIGN PATENT DOCUMENTS

| | | |
|---|---|---|
| JP | 2008-173924 A | 7/2008 |
| JP | 2015-208882 A | 11/2015 |

OTHER PUBLICATIONS

Extended European Search Report for Application No. EP 17 15 8980 dated Aug. 9, 2017 (7 pages).

\* cited by examiner

*Primary Examiner* — Geoffrey Mruk
(74) *Attorney, Agent, or Firm* — Harness, Dickey & Pierce, P.L.C.

(57) ABSTRACT

A piezoelectric device includes a piezoelectric layer, a first moisture resistant layer, and a second moisture resistant layer stacked in this order. The first moisture resistant layer has a flexibility higher than that of the second moisture resistant layer, and the second moisture resistant layer has a moisture permeability lower than that of the first moisture resistant layer.

20 Claims, 5 Drawing Sheets

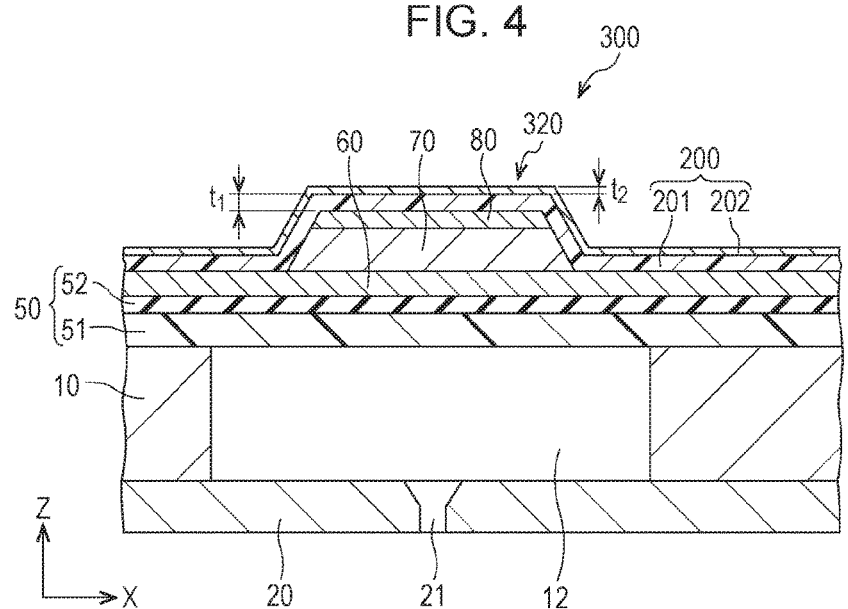
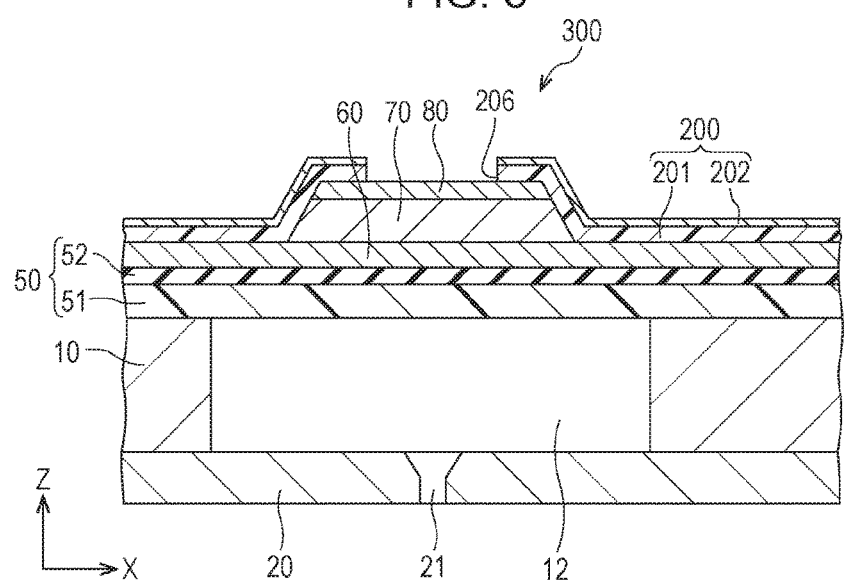

PIEZOELECTRIC DEVICE, MEMS DEVICE, LIQUID EJECTING HEAD, AND LIQUID EJECTING APPARATUS

BACKGROUND

1. Technical Field

The present invention relates to a piezoelectric device having a piezoelectric layer, a MEMS device having a piezoelectric device, a liquid ejecting head, and a liquid ejecting apparatus.

2. Related Art

An example of a piezoelectric element used in a piezoelectric device is a piezoelectric element having a structure in which a piezoelectric material exhibiting an electromechanical conversion function is held between two electrodes, namely, a lower electrode and an upper electrode. Examples of such a piezoelectric material include a piezoelectric layer composed of a crystalline dielectric material. Such a piezoelectric element is generally called as a flexural vibration mode actuator, and used by being mounted on a liquid ejecting head or the like. One of the typical examples of a liquid ejecting head includes an ink jet recording head including a pressure generating chamber which communicates with a nozzle opening for ejecting ink droplets, a part of the pressure generating chamber being formed of a vibrating plate. Ink droplets are ejected from the nozzle opening by deforming the vibrating plate with a piezoelectric element to pressurize the ink in the pressure generating chamber.

As a piezoelectric device used for such as an ink jet recording head, a piezoelectric device having a piezoelectric layer formed of a piezoelectric material and a protective film covering the piezoelectric layer has been proposed (for example, See JP-A-2008-173924 and JP-A-2015-208882).

However, when the piezoelectric layer is covered with the protective film, the protective film disturbs the displacement of the piezoelectric layer. Accordingly, desired displacement characteristics may not be obtained.

Further, when the thickness of the protective film is reduced to suppress the disturbance to the displacement of the piezoelectric layer by the protective film, it may become difficult to fully protect the piezoelectric layer from the environment such as moisture in air by the protective film.

Such problems arise not only in a piezoelectric device used for a liquid ejecting head represented by an ink jet recording head, but also in other piezoelectric devices as well.

SUMMARY

An advantage of some aspects of the invention is that a piezoelectric device, a MEMS device, a liquid ejecting head, and a liquid ejecting apparatus are provided in which deterioration of displacement characteristics is suppressed while protection of a piezoelectric layer is ensured.

A piezoelectric device according to an aspect of the invention includes a piezoelectric layer, a first moisture resistant layer, and a second moisture resistant layer stacked in this order. The first moisture resistant layer has a flexibility higher than a flexibility of the second moisture resistant layer, and the second moisture resistant layer has a moisture permeability lower than a moisture permeability of the first moisture resistant layer.

According to such an aspect, breakdown of the piezoelectric layer due to moisture can be avoided by providing a second moisture resistant layer. Also, disturbance to the deformation of the piezoelectric layer by the moisture resistant layer can be suppressed by providing the first moisture resistant layer.

The first moisture resistant layer preferably has a Young's modulus lower than a Young's modulus of the second moisture resistant layer. In this case, disturbance to the deformation of the piezoelectric layer by the first moisture resistant layer and the second moisture resistant layer can be suppressed.

The second moisture resistant layer is preferably thinner than the first moisture resistant layer. In this case, disturbance to the deformation of the piezoelectric layer by the first moisture resistant layer and the second moisture resistant layer can be suppressed by reducing the thickness of the second moisture resistant layer formed of a relatively hard material. In general, a material having low diffusivity of water vapor is relatively hard.

The second moisture resistant layer is preferably composed of a metal. In this case, breakdown of the piezoelectric layer due to water can be avoided, since diffusivity of moisture is low in a metal.

The first moisture resistant layer is preferably composed of an organic compound. In this case, disturbance to the deformation of the piezoelectric layer by the first moisture resistant layer can be suppressed by using a relatively soft material.

The first moisture resistant layer is preferably composed of polyimide. In this case, disturbance to the deformation of the piezoelectric layer by the first moisture resistant layer can be suppressed, since a relatively soft material is used.

The second moisture resistant layer is preferably composed of chromium. In this case, breakdown of the piezoelectric layer due to moisture can be avoided.

A piezoelectric device according to another aspect of the invention includes a piezoelectric layer, a first moisture resistant layer, and a second moisture resistant layer stacked in this order. The first moisture resistant layer has a flexibility higher than a flexibility of the second moisture resistant layer, and the second moisture resistant layer contains a material oxidized by water vapor.

According to the aspect, by using a material which is oxidized by water vapor for the second moisture resistant layer, the second moisture resistant layer can trap water, and prevents permeation of moisture to the inside of the second moisture resistant layer. In this case, breakdown of the piezoelectric layer due to water can be avoided. Also, by providing the first moisture resistant layer, disturbance to the deformation of the piezoelectric layer by the moisture resistant layer can be suppressed.

According to another aspect of the invention, there is provided a MEMS device including the piezoelectric device according to the aforementioned aspect.

According to the aspect, a MEMS device in which disturbance to the deformation of the piezoelectric layer is suppressed while the piezoelectric layer is protected can be obtained.

According to another aspect of the invention, there is provided a liquid ejecting head including the piezoelectric device according to the aforementioned aspect.

According to the aspect, a liquid ejecting head in which deterioration of the liquid ejecting property is avoided while the piezoelectric layer is protected can be obtained.

According to still another aspect of the invention, there is provided a liquid ejecting apparatus including the liquid ejecting head according to the aforementioned aspect.

According to the aspect, a liquid ejecting apparatus in which deterioration of the liquid ejecting property is avoided while the piezoelectric layer is protected can be obtained.

BRIEF DESCRIPTION OF THE DRAWINGS

The invention will be described with reference to the accompanying drawings, wherein like numbers reference like elements.

FIG. 4 is a cross-sectional view taken along the line IV-IV of FIG. 3.

FIG. 5 is a cross-sectional view of a main part illustrating a modified example of the recording head according to Embodiment 1 of the invention.

DESCRIPTION OF EXEMPLARY EMBODIMENTS

Hereinafter, embodiments of the invention will be described in detail.

Embodiment 1

Figure 1:
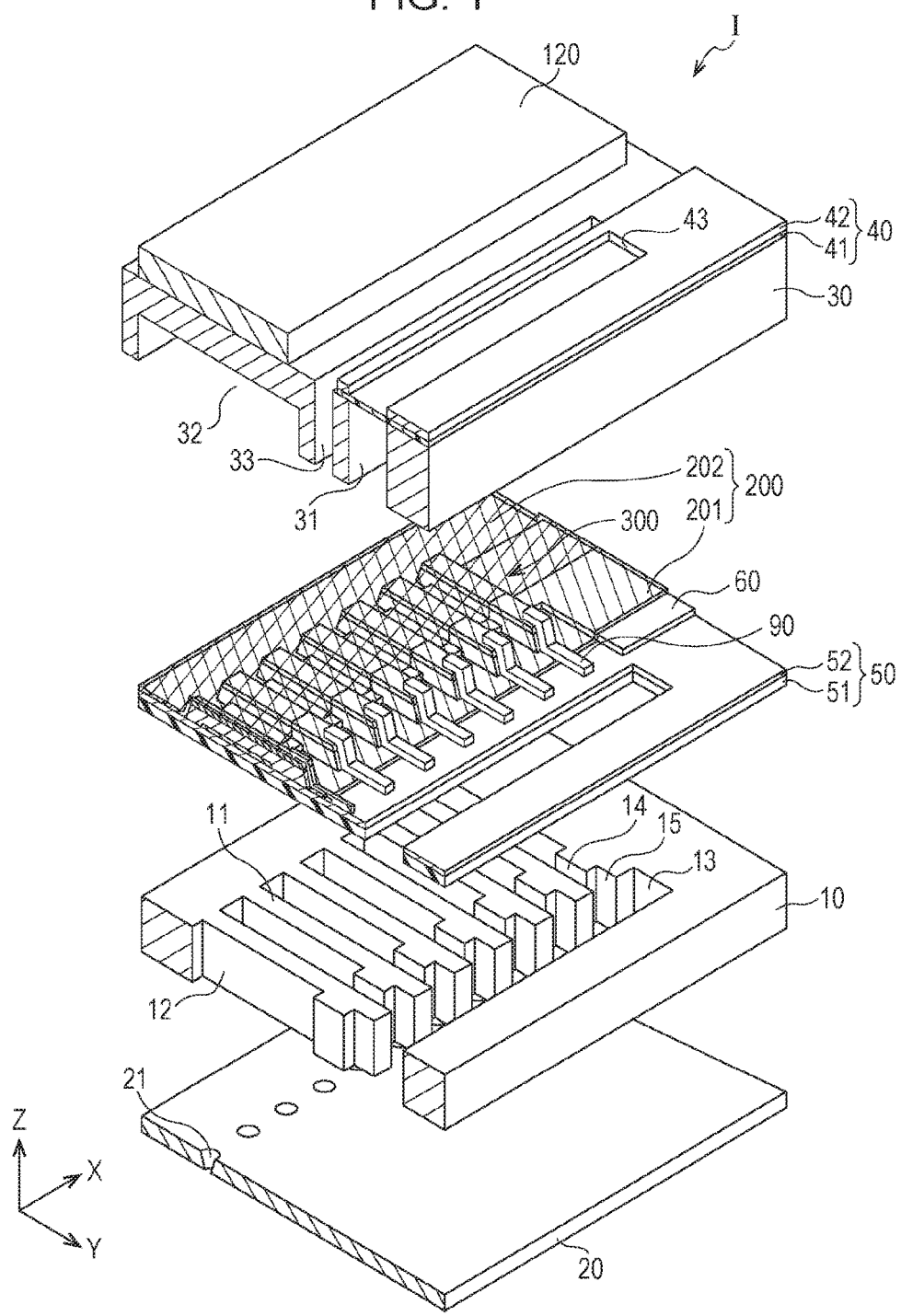
FIG. 1 is an exploded perspective view of a recording head according to Embodiment 1 of the invention.
Figure 2:
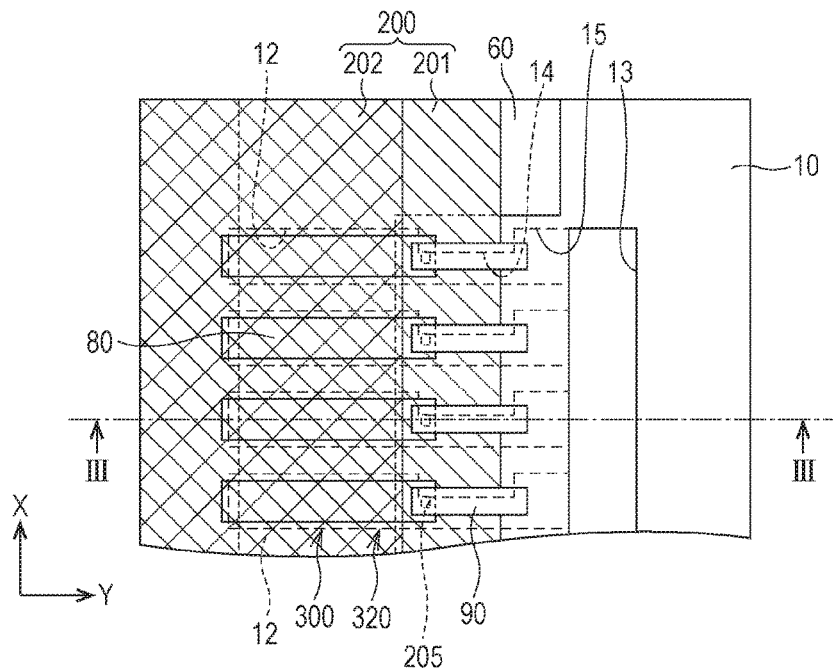
FIG. 2 is a plan view of a recording head according to Embodiment 1 of the invention.
Figure 3:
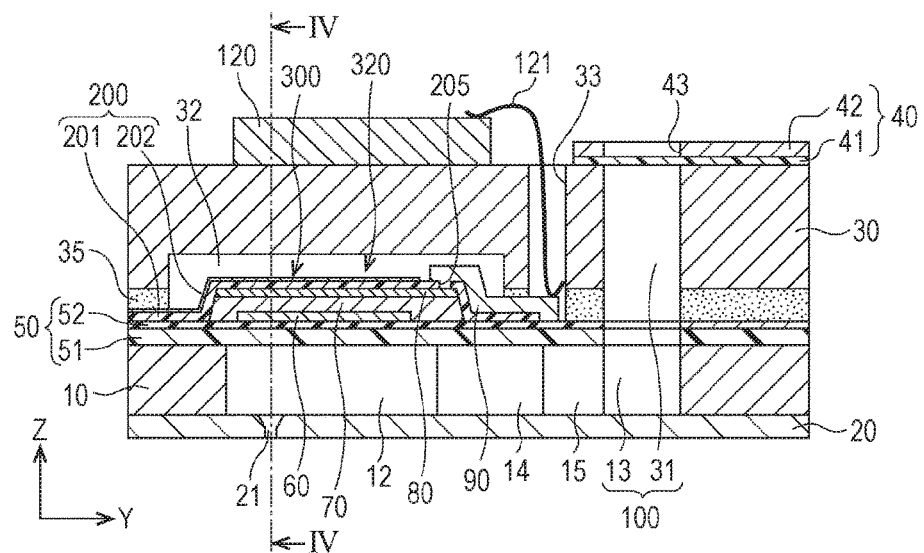
FIG. 3 is a cross-sectional view taken along the line III-III of FIG. 2.

FIG. 1 is an exploded perspective view illustrating a schematic configuration of an ink jet recording head as an example of a liquid ejecting head according to Embodiment 1 of the invention, FIG. 2 is a plan view of the ink jet recording head, FIG. 3 is a sectional view taken along the line III-III of FIG. 2 and FIG. 4 is a sectional view taken along the line IV-IV of FIG. 3.

Examples of a material forming a passage forming substrate 10 constituting the ink jet recording head I as illustrated in the figures include: a metal such as stainless steel or Ni; a ceramic material, typically $ZrO_2$ or $Al_2O_3$; a glass ceramic material; and an oxide such as MgO or $LaAlO_3$. According to this embodiment, the passage forming substrate 10 is formed of a single-crystal silicon substrate. In the passage forming substrate 10, by anisotropically etching the substrate from one surface, a plurality of pressure generating chambers 12 partitioned by a plurality of partition walls 11 are arranged in parallel to a direction in which a plurality of nozzle openings 21 for ejecting ink are arranged. In this embodiment, this direction is denoted as a pressure generating chamber 12 arranging direction or a first direction X. Also, in the plane of a liquid ejecting surface where the nozzle openings 21 open, a direction perpendicular to the first direction X is denoted as a second direction Y. Further, in this embodiment, a direction intersecting both the first direction X and the second direction Y is denoted as a third direction Z. In this embodiment, the relationship between any two of the directions X, Y, and Z is an orthogonal relationship, however, the invention is not limited thereto.

In the passage forming substrate 10, ink supply passages 14 and communication passages 15 are formed at an end in the second direction Y of the pressure generating chambers 12. Both the ink supply passages 14 and the communication passages 15 are partitioned by the partition walls 11. A communication section 13 constituting a part of a manifold 100 as a common ink chamber (liquid chamber) of the pressure generating chambers 12 is formed at ends of the communication passages 15. Namely, in the passage forming substrate 10, liquid passages including pressure generating chambers 12, a communication section 13, ink supply passages 14, and communication passages 15 are formed.

Each of the ink supply passages 14 communicates with one end in the second direction Y of the pressure generating chamber 12 and has a cross-sectional area smaller than that of the pressure generating chamber 12. For example, in this embodiment, the width of the ink supply passage 14 is formed to be smaller than the width of the pressure generating chamber 12 by narrowing the pressure generating chamber 12 side passage between the manifold 100 and the pressure generating chamber 12 in the first direction X, namely, the width direction. In this embodiment, the ink supply passage 14 is formed by narrowing the width of the passage from one side, however, the ink supply passage may be formed by narrowing the width of the passage from both sides in the first direction X. Alternatively, the ink supply passage may be formed not by narrowing the width of the passage but by narrowing the passage in the third direction Z, namely, the thickness direction. Further, each of the communication passages 15 communicates with the corresponding ink supply passage 14 on a side opposite to the pressure generating chamber 12 and has a cross-sectional area in the width direction (transverse direction) larger than that of the ink supply passage 14. In this embodiment, the communication passage 15 is formed so as to have the same cross-sectional area as that of the pressure generating chamber 12.

Namely, in the passage forming substrate 10, the following passages are partitioned by the plurality of partition walls 11, namely, the pressure generating chambers 12, the ink supply passages 14 each having a cross-sectional area in the transverse direction smaller than that of the pressure generating chamber 12, the communication passages individually communicating with the corresponding ink supply passages 14 and having a cross-sectional area in the transverse direction larger than that of the ink supply passages 14.

Nozzle openings 21 individually communicating with the pressure generating chambers 12 near the ends opposite to the ink supply passages 14 are bored through a nozzle plate 20. The nozzle plate 20 is firmly fixed to an opening surface side of the passage forming substrate 10 using an adhesive or a heat welding film. The nozzle plate 20 may be formed of, for example, a metal such as stainless steel (SUS), an organic material such as a polyimide resin, a glass ceramic, or a single-crystal silicon substrate. When a single-crystal silicon substrate, which is the same material as used in the passage forming substrate 10, is used to form the nozzle plate 20, the occurrence of, for example, warpage caused by heating or cooling, cracks due to heat, and peeling can be suppressed, since the linear expansion coefficients of the nozzle plate 20 and the passage forming substrate 10 become the same.

A vibrating plate 50 is formed on a surface of the passage forming substrate 10 opposite to the nozzle plate 20. In this embodiment, the vibrating plate 50 is constituted of an elastic film 51 provided on the passage forming substrate side, which is composed of silicon oxide, and an insulator film 52 formed on the elastic film 51, which is composed of zirconium oxide. The liquid passage such as that of the pressure generating chamber 12 is formed by anisotropically etching the passage forming substrate 10 from the nozzle plate 20 side surface. The other surface of the liquid passage such as that of the pressure generating chamber 12 is defined and formed by the elastic film 51.

Further, on the insulator film 52 of the vibrating plate 50, a first electrode 60, a piezoelectric layer 70 and a second electrode 80 are stacked to form a piezoelectric element 300 through film formation and lithography in this embodiment. The piezoelectric element 300 denotes a portion including the first electrode 60, the piezoelectric layer 70 and the second electrode 80. Generally, one of the electrodes of the piezoelectric element 300 is formed as a common electrode, and another electrode and the piezoelectric layer 70 are formed by patterning for each pressure generating chamber 12. Here, the portion including one of the electrodes obtained through patterning and the piezoelectric layer 70, the portion causing piezoelectric distortion by application of a voltage to both the electrodes, is denoted as an active portion 320. In this embodiment, the first electrode 60 is formed as a common electrode of the piezoelectric element 300 and the second electrode 80 is formed as an individual electrode of the piezoelectric element 300, however, there is no problem in interchanging these electrodes so as to accommodate the arrangement of the drive circuit or the wiring. In the above example, the first electrode 60 works as a part of the vibrating plate since the first electrode 60 is continuously provided across the plurality of pressure generating chambers 12. However, the invention is not limited to such an embodiment, of course. For example, the first electrode may solely function as a vibrating plate without providing either or both of the aforementioned elastic film 51 and the insulator film 52.

Examples of a material forming the piezoelectric layer 70 constituting such a piezoelectric element 300 include, a ferroelectric piezoelectric material such as lead zirconate titanate (PZT), and a relaxor ferroelectric obtained by adding a metal such as niobium, nickel, magnesium, bismuth, or yttrium, thereto.

Such a piezoelectric layer 70 is provided to each of the pressure generating chambers 12 by separating the piezoelectric layer 70 into pieces together with the second electrode 80. Namely, the first electrode 60 is continuously provided across the plurality of the pressure generating chambers 12 and works as a common electrode of the plurality of the active portions 320. The piezoelectric layer 70 and the second electrode 80 are separated into pieces for each of the pressure generating chambers 12, and the second electrode 80 works as an individual electrode of each of the active portions 320. Namely, in each of the piezoelectric elements 300, the second electrode 80 is provided only on the surface of the piezoelectric layer 70 opposite to the passage forming substrate 10 in the third direction Z, and the side surface of the piezoelectric layer 70, namely, the surface in the direction intersecting both the first direction X and the second direction Y of the piezoelectric layer 70 is not covered with the second electrode 80.

Such a piezoelectric element 300 is covered with a moisture resistant layer 200. In this embodiment, the moisture resistant layer 200 is formed of a first moisture resistant layer 201 provided on the piezoelectric layer 70 side and a second moisture resistant layer 202 provided on the surface of the first moisture resistant layer 201 opposite to the piezoelectric layer 70. Namely, the piezoelectric layer 70, the first moisture resistant layer 201 and the second moisture resistant layer 202 are stacked in this order.

At least in the active portion 320, the moisture resistant layer 200 such as that described above may cover only the side surface of the piezoelectric layer 70 where the second electrode 80 is not provided. In this embodiment, the first moisture resistant layer 201 is provided so as to cover the entire surface of the passage forming substrate 10 of the piezoelectric element 300 side. That is, the first moisture resistant layer 201 is formed to cover the side surfaces of both the piezoelectric layer 70 and the second electrode 80 as well as the upper surface of the second electrode 80, while continuously covering the plurality of piezoelectric elements 300. Accordingly, in this embodiment, the first moisture resistant layer 201 is formed even on the first electrode 60 formed between two piezoelectric elements 300 neighboring in the first direction X.

Further, the second moisture resistant layer 202 is formed on the area of the piezoelectric element 300 other than an end area in the second direction Y where a lead electrode 90 is connected, namely, formed on the area which includes the active portion 320. The lead electrode 90, which will be described in detail later, is connected to the second electrode 80 on the outside of the active portion 320. Accordingly, even when the second moisture resistant layer 202 is not provided on this area, the second moisture resistant layer 202 may be provided on the area including the active portion 320.

In this manner, breakdown of the piezoelectric element 300 due to moisture in air can be suppressed by covering the piezoelectric element 300 with the moisture resistant layer 200.

Here, the first moisture resistant layer 201 is composed of a material having an insulating property and being more flexible than the second moisture resistant layer 202. Specifically, the first moisture resistant layer 201 is preferably composed of a material exhibiting a Young's modulus lower than that of the second moisture resistant layer 202. Accordingly, disturbance to the deformation of the piezoelectric element 300 by the first moisture resistant layer 201 can be reduced. Further, by employing an insulating material as the first moisture resistant layer 201, the first moisture resistant layer 201 may be continuously formed over the first electrode 60 and the second electrode 80. Thus, the side surface of the piezoelectric layer 70 can be reliably covered with the first moisture resistant layer 201. The first moisture resistant layer 201 is preferably composed of an organic compound. An organic compound used for the first moisture resistant layer 201 may be at least one selected from, for example, an epoxy resin, a polyimide resin, a silicon-containing resin, a fluorine-containing resin, and a polyurethane resin. The first moisture resistant layer 201 composed of an organic insulation material may be formed by, for example, a spin coating method or a spray coating method. In this way, by using an organic compound as the first moisture resistant layer 201, a material having a relatively low Young's modulus, a high flexibility, and an insulating property can be used for the first moisture resistant layer 201. The physical properties of polyimide and polyurethane resins which may be used for the first moisture resistant layer 201 will be shown in Table 1 below.

TABLE 1

|  | Thickness (μm) | Bulk Young's Modulus (GPa) | Moisture Permeability (cc/m$^2$/24 hr) |
| --- | --- | --- | --- |
| Polyimide | 2 to 5 | 3 to 5 | 390 |
| Polyurethane | 2 to 5 | 0.01 to 0.06 | 2700 |

The material used for forming the first moisture resistant layer 201 is not limited to an organic compound, and an inorganic insulating material may alternatively be used. The inorganic insulating material may be at least one selected from, for example, silicon oxide ($SiO_x$), zirconium oxide ($ZrO_x$), tantalum oxide ($TaO_x$), aluminum oxide ($AlO_x$), and titanium oxide ($TiO_x$). However, since an inorganic insulating material generally has a Young's modulus relatively higher than that of an organic compound, it may disturb the displacement of the piezoelectric element 300. Accordingly, as a material used for the first moisture resistant layer 201, an organic compound is preferably used. In this embodiment, polyimide is used for the first moisture resistant layer 201.

The second moisture resistant layer 202 is composed of a material having a moisture permeability lower than that of the first moisture resistant layer 201. Here, the phrase "the second moisture resistant layer 202 is composed of a material having a moisture permeability lower than that of the first moisture resistant layer 201" means that the amount of water vapor passing through the second moisture resistant layer 202 is smaller than the amount of water vapor passing through the first moisture resistant layer 201. Here, the amount of gas permeating through a membrane is inversely proportional to the thickness of the membrane and proportional to the diffusion coefficient of the gas. Therefore, when a second moisture resistant layer 202 having a thickness equal to or smaller than the thickness of the first moisture resistant layer 201 is used (namely, the thickness of the second moisture resistant layer 202≤the thickness of the first moisture resistant layer 201), the second moisture resistant layer 202 is preferably formed of a material through which water vapor is more difficult to diffuse than through the first moisture resistant layer 201, namely, a material having a diffusion coefficient of water vapor smaller than that of the first moisture resistant layer 201 (namely, the diffusion coefficient of water vapor in the second moisture resistant layer 202<the diffusion coefficient of water vapor in the first moisture resistant layer 201). Alternatively, when a second moisture resistant layer 202 having a thickness larger than the thickness of the first moisture resistant layer 201 is used (namely, the thickness of the second moisture resistant layer 202>the thickness of the first moisture resistant layer 201), the second moisture resistant layer 202 may be formed of a material through which water vapor is easier to diffuse than through the first moisture resistant layer 201 (namely, the diffusion coefficient of water vapor in the second moisture resistant layer 202>the diffusion coefficient of water vapor in the first moisture resistant layer 201). However, this is not preferable because, when a material having a Young's modulus lower than the Young's modulus of the second moisture resistant layer 202 is used in the first moisture resistant layer 201, the increase in the thickness of the second moisture resistant layer 202 results in an increase in the total Young's modulus of the moisture resistant layer 200. Thus, the displacement of the piezoelectric element 300 may be disturbed. Accordingly, the second moisture resistant layer 202 is preferably formed of a material through which diffusion of water vapor is more difficult than through the first moisture resistant layer 201. Further, when a material having a Young's modulus lower than that of the second moisture resistant layer 202 is used in the first moisture resistant layer 201, the thickness $t_2$ of the second moisture resistant layer 202 is preferably smaller than the thickness $t_1$ of the first moisture resistant layer 201 (namely, the thickness $t_2$ of the second moisture resistant layer 202<the thickness $t_1$ of the first moisture resistant layer 201). Accordingly, increase in the total Young's modulus of the moisture resistant layer 200 is suppressed and the disturbance to displacement of the piezoelectric element 300 can be avoided.

For such a second moisture resistant layer 202, an organic compound or an inorganic material may be used. As an organic compound, for example, a material similar to those described above for the first moisture resistant layer 201 may be used. As an inorganic material, for example, a metal, a compound containing a metal, or an inorganic insulating material similar to those described above for the first moisture resistant layer 201 may be used. Namely, an inorganic material usable in the second moisture resistant layer 202 may be at least one selected from nickel (Ni), chromium (Cr), copper (Cu), silicon oxide ($SiO_x$), zirconium oxide ($ZrO_x$), tantalum oxide ($TaO_x$), aluminum oxide ($AlO_x$), and titanium oxide ($TiO_x$).

Since the second moisture resistant layer 202 is not provided at the end portion in the second direction Y where the lead electrode 90 of the piezoelectric element 300 is connected, either a material having conductivity or a material having an insulating property may be used. When a material having an insulating property is used for the second moisture resistant layer 202, the second moisture resistant layer 202 may be provided over the entire surface of the first moisture resistant layer 201.

Also, a material which is oxidized by water vapor can be used for the second moisture resistant layer 202. Examples of a material which is oxidized by water vapor include nickel (Ni) and chromium (Cr). By using a material which is oxidized by water vapor for the second moisture resistant layer 202, the second moisture resistant layer 202 can trap water, whereby permeation of moisture into the second moisture resistant layer 202 can be prevented. In this embodiment, chromium (Cr) is used for the second moisture resistant layer 202.

The properties of nickel (Ni), chromium (Cr), copper (Cu), zirconium oxide ($ZrO_2$), and aluminum oxide ($Al_2O_3$), which may be used for the second moisture resistant layer 202, will be indicated in Table 2 below.

TABLE 2

|  | Thickness (μm) | Young's Modulus of Thin Film (GPa) | Bulk Young's Modulus (GPa) | Moisture Permeability ($cc/m^2/24$ hr) |
|---|---|---|---|---|
| Ni | 1 to 5 | 110 to 180 | 200 to 220 | Not Detected |
| Cr | 1 to 5 | 250 | 285 to 290 (Amorphous: 570) | Not Detected |
| Cu | 1 to 5 | 160 | — | Not Detected |
| $ZrO_2$ | 1 | 165 to 200 | 300 | Not Detected |
| $Al_2O_3$ | 1 | 180 to 250 | 385 to 392 | Not Detected |

As described above, disturbance to the displacement of the piezoelectric element 300 by the moisture resistant layer 200 can be suppressed by providing a first moisture resistant layer 201 exhibiting a high flexibility in the moisture resistant layer 200 protecting the piezoelectric layer 70. Accordingly, the piezoelectric element 300 is capable of obtaining a desired displacement property and, as a result, desired ink (liquid) ejection characteristics can be obtained.

Further, by providing, in the moisture resistant layer 200, a second moisture resistant layer 202 formed of a material through which diffusion of water vapor is more difficult than through the first moisture resistant layer 201, the moisture resistant layer 200 protects the piezoelectric layer 70 from the external environment such as moisture in air, whereby the occurrence of leak current on the surface of the piezoelectric layer 70 due to moisture can be suppressed.

When only the first moisture resistant layer 201 is provided on the piezoelectric element 300, disturbance to the deformation of the piezoelectric element 300 can be further reduced, however, sufficient protection of the piezoelectric layer 70 from moisture is not secured by using only the first moisture resistant layer 201. Alternatively, when only the second moisture resistant layer 202 is provided on the piezoelectric element 300, the piezoelectric layer 70 can be protected from moisture, however, the deformation of the piezoelectric element 300 is disturbed. As a result, the desired displacement property may not be obtained. Also, when only the second moisture resistant layer 202 is provided, an insulating material must be used so as not to cause a short-circuit between the first electrode 60 and the second electrode 80 by the second moisture resistant layer 202. Therefore, the range of usable materials becomes limited. In this embodiment, by providing, in the moisture resistant layer 200, a first moisture resistant layer 201 exhibiting a high flexibility and a second moisture resistant layer 202 formed of a material through which diffusion of water vapor is difficult, the piezoelectric layer 70 can be reliably protected from moisture without causing a high total stiffness of the moisture resistant layer 200. Accordingly, disturbance to the deformation of the piezoelectric element 300 by the moisture resistant layer 200 can be suppressed. Further, when an insulating material is used to form the first moisture resistant layer 201, a conductive material may be used for the second moisture resistant layer 202, and therefore a material through which water vapor is more difficult to diffuse can be used to form the second moisture resistant layer 202.

On the first moisture resistant layer 201 forming such a moisture resistant layer 200, a lead electrode 90 formed of, for example, gold (Au) is provided. One end of the lead electrode 90 is connected to the second electrode 80 through a contact hole 205 provided on the first moisture resistant layer 201, and the other end is extended to the passage forming substrate 10 of the ink supply passage 14 side, and the extended tip portion is connected to a driving circuit 120 driving the piezoelectric element 300, which will be described later, through a connection wiring 121. As described above, the second moisture resistant layer 202 is not provided on the area where the lead electrode 90 is formed. Therefore, a short-circuit between the lead electrode 90 and the first electrode 60 caused by the second moisture resistant layer 202 can be avoided.

On the passage forming substrate 10 on which the piezoelectric element 300 is formed, a protective substrate is bonded via an adhesive 35. In the protective substrate 30, a manifold portion 31 is provided in a region opposing the communication section 13. This manifold portion 31 constitutes a manifold 100 which works as a common liquid chamber to each pressure generating chamber 12 by communicating with the communication section 13 of the passage forming substrate 10 as described above. Alternatively, only the manifold portion 31 may be used as a manifold by dividing the communication section 13 of the passage forming substrate 10 into a plurality of portions for each pressure generating chamber 12. Further, it is also possible that, for example, only pressure generating chambers 12 are formed in the passage forming substrate 10, and ink supply passages 14 communicating with a manifold and each pressure generating chamber 12 are formed in a member existing between the passage forming substrate 10 and the protective substrate 30, for example, the vibrating plate 50.

A piezoelectric element preserver 32 securing a space so as not to interrupt the movement of the piezoelectric element 300 is formed in an area opposing the piezoelectric element 300 of the protective substrate 30. The piezoelectric element preserver 32 needs only have sufficient space so as not to interrupt the movement of the piezoelectric element 300. In addition, the space may be air tightly sealed or not sealed.

In a region between the piezoelectric element preserver 32 and the manifold portion 31 of the protective substrate 30, a through-hole 33 perforating through the protective substrate 30 in the thickness direction is formed. Portions of the first electrodes 60 and tips of the lead electrodes 90 are exposed in the through-hole 33.

A driving circuit 120 for driving the piezoelectric elements 300 is mounted on the protective substrate 30. The driving circuit 120 may be formed of, for example, a semiconductor integrated circuit (IC). The driving circuit 120 and the lead electrodes 90 are electrically connected to each other through connection wiring 121 formed of a conductive wire such as a bonding wire.

The protective substrate 30 is preferably formed of a material having substantially the same thermal expansion coefficient as that of the passage forming substrate 10, for example, glass, a ceramic material, or an oxide. In this embodiment, the protective substrate 30 is formed of a single-crystal silicon substrate which is the same material as that used for the passage forming substrate 10.

A compliance substrate 40 including a sealing film and a fixing plate 42 is bonded onto the protective substrate 30. The sealing film 41 is formed of a material having a low rigidity and a flexible property, for example, a polyphenylene sulfide (PPS) film of 6 μm in thickness. One surface of the manifold portion 31 is sealed with the sealing film 41. The fixing plate 42 is formed of a hard material such as a metal, for example, stainless steel (SUS) of 30 μm in thickness. Since an area opposite the manifold 100 of the fixing plate 42 is an opening 43 completely removed in the thickness direction, one surface of the manifold 100 is sealed only with the sealing film 41 having a flexible property.

In the ink jet recording head according to this embodiment, ink is supplied from an external ink supplying mechanism (not shown), the inside, from the manifold 100 to the nozzle openings 21, is filled with the ink, and ink droplets are ejected from the nozzle openings 21 by applying a voltage between the first electrode 60 and the second electrode 80 corresponding to each of the pressure generating chambers 12 in accordance with a print signal supplied from the driving circuit 120, deforming the vibrating plate 50, the first electrode 60, and the piezoelectric layer 70 so as to be bent, and increasing the pressure in each of the pressure generating chambers 12.

In this embodiment, as the moisture resistant layer 200, the first moisture resistant layer 201 and the second moisture resistant layer 202 are provided. However, the invention is not limited thereto, and the moisture resistant layer 200 may be formed by stacking three or more layers.

Further, in this embodiment, the moisture resistant layer 200 is formed on the upper surface of the second electrode 80, namely, the main part which is in the substantially central region of the surface opposite to the passage forming substrate 10 in the third direction Z. However, the invention is not limited thereto, and at least in the active portion 320, the moisture resistant layer 200 only has to cover the side surface of the piezoelectric layer 70, which is not covered by the second electrode 80. Here, a modified example of a moisture resistant layer 200 is illustrated in FIG. 5. FIG. 5 is a cross-sectional view of a main part of a recording head illustrating a modified example of the moisture resistant layer according to Embodiment 1 of the invention.

As illustrated in FIG. 5, the moisture resistant layer 200 is not provided on the upper surface of the second electrode 80 of the piezoelectric element 300, namely, the main part which is the substantially central region of the surface opposite to the passage forming substrate 10 in the third direction Z, and an opening 206 which opens a main portion of the upper surface of the second electrode 80 is provided in the moisture resistant layer 200. The opening 206 penetrates the moisture resistant layer 200 in the third direction Z, and opens in a rectangular shape along the second direction Y of the piezoelectric element 300. Namely, the moisture resistant layer 200 according to this embodiment is formed to cover a side surface and a peripheral portion of the top surface of the second electrode 80, and a side surface of the piezoelectric layer 70.

As described above, even when the opening 206 is formed in the moisture resistant layer 200, breakdown of the piezoelectric layer 70 due to moisture can be avoided and disturbance to the deformation of the piezoelectric element 300 by the moisture resistant layer 200 can be suppressed, by covering the side surface of the piezoelectric layer 70 with the moisture resistant layer 200.

Further, by providing the opening 206, disturbance to the deformation of the piezoelectric element 300, namely, the active portion 320, by the moisture resistant layer 200 can be further suppressed, and the displacement characteristic can be further improved.

In the example illustrated in FIG. 5, the moisture resistant layer 200 is formed by stacking the first moisture resistant layer 201 and the second moisture resistant layer 202. However, the invention is not limited thereto, and the moisture resistant layer 200 may be formed by stacking three or more layers.

Further, in this embodiment, the moisture resistant layer 200 is continuously formed to cover even the portion between the piezoelectric elements 300 neighboring in the first direction X. However, the invention is not limited thereto, and, for example, the moisture resistant layer 200 may be formed so that it becomes discontinuous between the piezoelectric elements 300 neighboring in the direction X. Even when such a constitution is adopted, by covering the side surface of the piezoelectric layer 70 with the moisture resistant layer 200, breakdown of the piezoelectric layer 70 due to moisture can be avoided and disturbance to the deformation of the piezoelectric element 300 by the moisture resistant layer 200 can be suppressed. Even in the moisture resistant layer 200 according to the aforementioned Embodiment 1, in which an opening 206 is not provided in the moisture resistant layer 200, the moisture resistant layer 200 may be provided so as to be discontinuous between the piezoelectric elements 300 neighboring in the first direction X.

Figure 6:
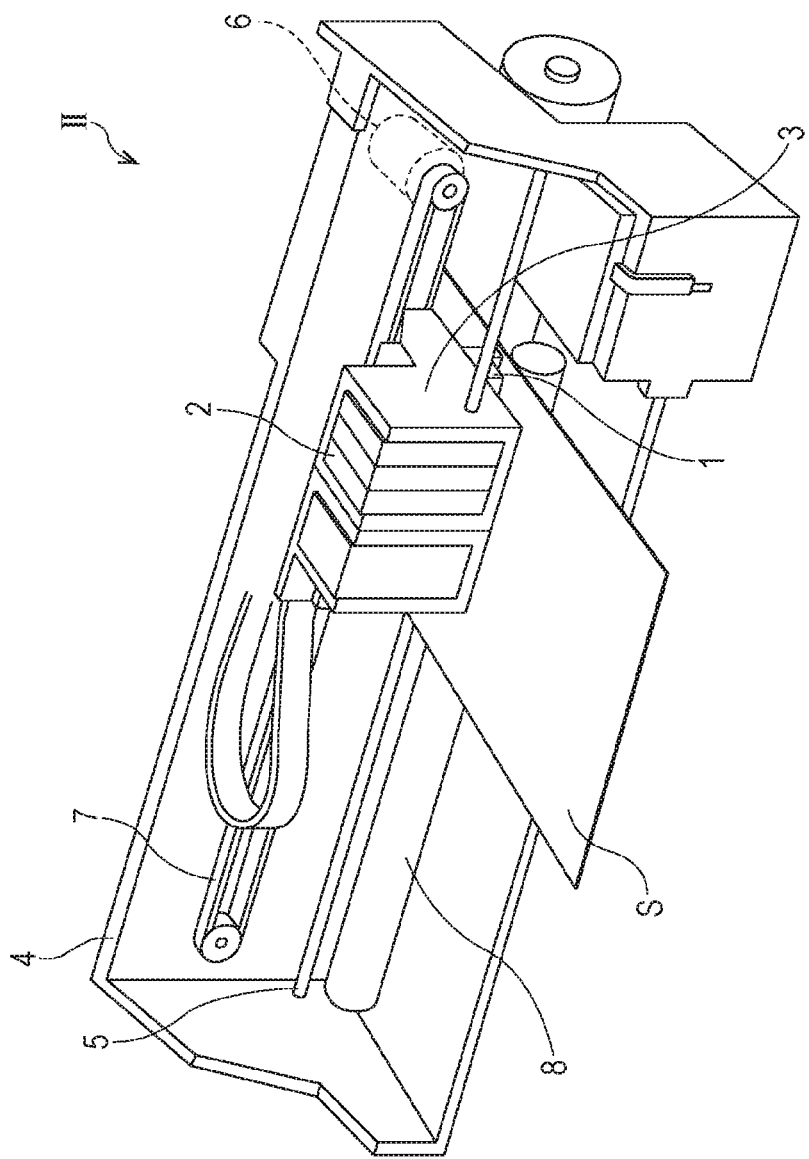
FIG. 6 is a diagram illustrating a schematic configuration of a recording apparatus according to Embodiment 1 of the invention.

The ink jet recording head I according to this embodiment constitutes a part of an ink jet recording head unit having an ink passage that communicates with an ink cartridge, or the like. The ink jet recording head I is mounted on an ink jet recording apparatus which is an example of a liquid ejecting apparatus. FIG. 6 is a schematic illustration of an example of such an ink jet recording apparatus.

In the ink jet recording apparatus II illustrated in FIG. 6, an ink jet recording head unit 1 (hereinafter, also referred to as a head unit 1) having a plurality of ink jet recording heads I, an ink cartridge 2 constituting ink supply mechanism is detachably mounted, and a carriage 3 on which the head unit 1 is mounted is installed on a carriage shaft 5 attached to an apparatus body 4 so as to be movable in the axial direction of the shaft.

The driving force of the driving motor 6 is conveyed to the carriage 3 through a plurality of gears (not shown) and a timing belt 7, and the carriage 3 mounted with the head unit 1 is moved along the carriage shaft 5. The apparatus body 4 is provided with a transport roller 8 as a transporting mechanism, and a recording sheet S which is a recording medium such as paper is transported by the transport roller 8. The transport mechanism for transporting the recording sheet S is not limited to a transport roller, and a belt, a drum or the like may be used.

Embodiment 2

Hereinafter, an ultrasonic sensor which is one of the embodiments of the invention will be described. This embodiment described below does not unduly limit the contents of the invention described in the claims, and all of the configurations described in this embodiment are not always indispensable as means to solve the invention. The same member as that described in Embodiment 1 is denoted by the same reference numeral, and duplicate description thereof is omitted.

In this embodiment, transmission and reception of an ultrasonic wave are performed using an electroacoustic transducer employing a piezoelectric effect. Such an electroacoustic transducer is a piezoelectric element. When an ultrasonic wave is generated, conversion of electric energy into mechanical energy (an inverse piezoelectric effect) is utilized, namely, a change due to shrinkage and elongation in a piezoelectric layer causes excitation of a vibrating plate which causes the vibrating plate to vibrate, thereby transmitting an ultrasonic wave. Therefore, in this case, the piezoelectric element is an ultrasonic transmitting transducer.

Further, in order to receive an ultrasonic wave emitted from an object to be detected, electric energy is generated by deformation of a piezoelectric layer by utilizing conversion of mechanical energy into electric energy (positive piezoelectric effect) and a signal of electric energy is detected. Therefore, in this case, the piezoelectric element is an ultrasonic receiving transducer.

In this embodiment, a piezoelectric element (an ultrasonic transducer) is constituted by a vibrating plate, a first electrode provided on the vibrating plate, a piezoelectric layer provided on the first electrode, and a second electrode provided on the piezoelectric layer. It is also possible to use the first electrode as a vibrating plate.

Figure 7:
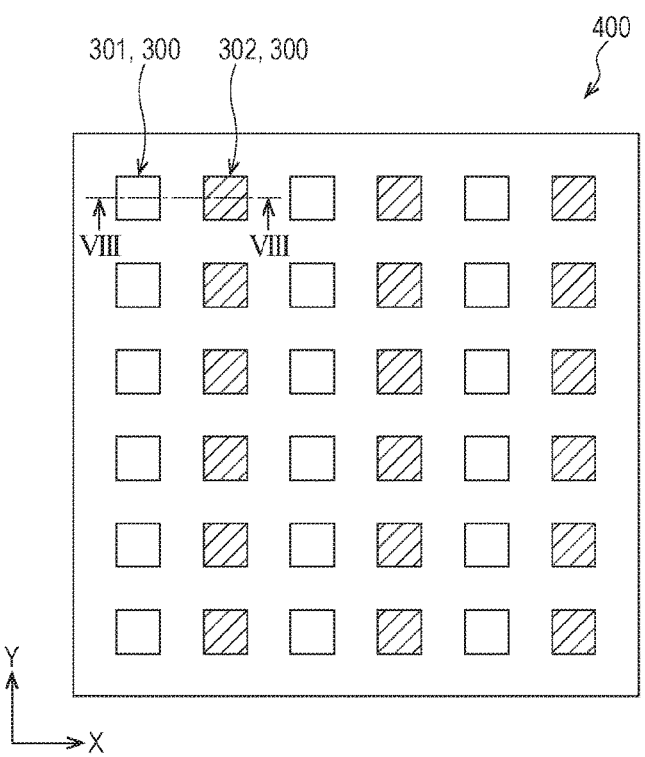
FIG. 7 is a plan view of an ultrasonic device according to Embodiment 2 of the invention.
Figure 8:
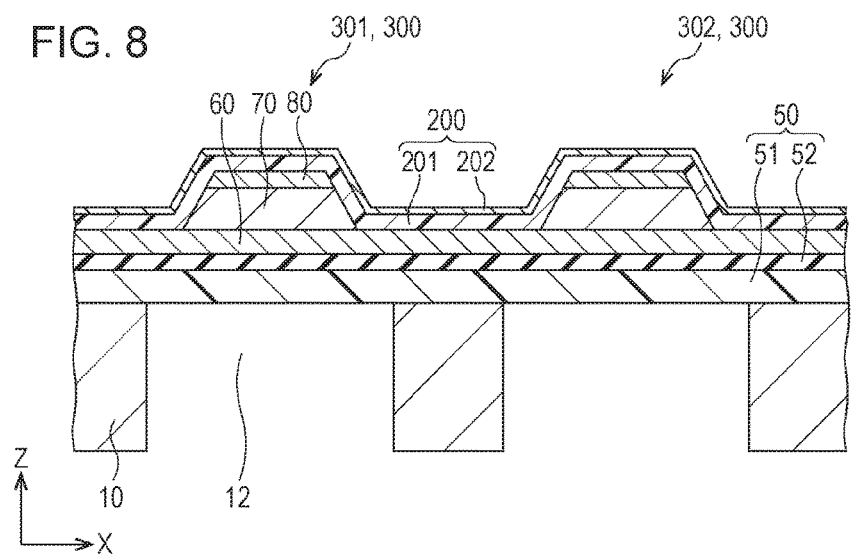
FIG. 8 is a cross-sectional view taken along the line VIII-VIII of FIG. 7.

FIG. 7 is a plan view of an ultrasonic device on which an ultrasonic transducer according to Embodiment 2 of the invention is mounted, and FIG. 8 is a sectional view taken along the line VIII-VIII in FIG. 7.

As illustrated in FIG. 7, a plurality of ultrasonic transmitting transducers 301 and ultrasonic receiving transducers 302 are provided in an arrayed manner on a substrate 10 having a substrate opening 12 to form an ultrasonic device 400 (an array sensor). A plurality of ultrasonic transmitting transducers 301 and a plurality of ultrasonic receiving transducers 302 are arranged alternately for each column and electric power is switched for each column of transducers. Line scanning and sector scanning are conducted in accordance with the switching of electric power. Also, the output level and input level of an ultrasonic wave are determined according to the number of transducers and the number of columns to which electric power is supplied. In the figure, only a small portion of 6 rows×6 columns are drawn. The number of rows and the number of columns of the array are determined according to the spread in the scanning range.

It is also possible to arrange the ultrasonic transmitting transducers 301 and the ultrasonic receiving transducers 302 alternately for each transducer. In this case, it becomes easier to match the directivity angles of transmission and reception by setting the ultrasonic transmission and reception sources so that the transmission side and the reception side have a common central axis.

In this embodiment, both ultrasonic transmitting transducers 301 and ultrasonic receiving transducers 302 are disposed on a single substrate 10 in order to reduce the size of the device, however, it is also possible to dispose the ultrasonic transmitting transducers 301 and the ultrasonic receiving transducers 302 on individual substrates according to the function of the ultrasonic transducer or use a plurality of substrates according to the usage. Furthermore, it is also possible to provide both transmission function and reception function in one ultrasonic transducer by utilizing the time difference between transmission and reception.

In FIG. 8, as an example that can be used for an ultrasonic transducer, a substrate 10 formed of a single-crystal silicon having a (100), (110) or (111) orientation may be cited. Examples of a material other than the silicon material include: a ceramic material typified by $ZrO_2$ or $Al_2O_3$; a glass ceramic material; an oxide substrate material such as MgO or $LaAlO_3$; and an inorganic material such as SiC, $SiO_2$, polycrystalline silicon, or $Si_3N_4$. A multi-layered material employing a combination of the above materials may also be used.

A vibrating plate 50 is formed above the substrate (the piezoelectric layer 70 side). In order to form the vibrating plate 50, a part of the substrate 10 may be used by thinning. Also, the piezoelectric layer 70 or the first electrode 60 may be used. It is also possible to form the vibrating plate 50 using another material. Examples of such another material include: a silicon-containing compound such as $SiO_2$, SiC, or $Si_3N_4$; polycrystalline silicon; a ceramic material such as $ZrO_2$ or $Al_2O_3$; and an oxide such as MgO, $LaAlO_3$, or $TiO_2$. The film thickness and the material are determined based on the resonance frequency. The surface layer of the piezoelectric layer 70 side of the vibrating plate 50 is preferably formed of a material such as $ZrO_2$, that can prevent diffusion of a material used for forming the piezoelectric layer. In this case, improvement of the piezoelectric property of the piezoelectric layer results in enhancement of the transmission and reception properties of the transducer.

On the substrate 10, a substrate opening 12 which is an opening is formed. The substrate opening 12 can be formed by a processing method such as etching, polishing, laser processing or the like in accordance with the substrate material.

Since the first electrode 60, the piezoelectric layer 70, and the second electrode 80 are the same as those in Embodiment 1, description on the configuration is omitted. In contrast to Embodiment 1, it is necessary to drive the ultrasonic device in a higher frequency region when compared with the liquid ejecting head typified by the ink jet recording head I. Accordingly, physical property values such as the thickness and Young's modulus of the piezoelectric layer 70, the vibrating plate 50, and each electrode material may be adjusted.

Further, wiring (not shown) is connected to each of the ultrasonic transmitting transducers 301 and the ultrasonic receiving transducers 302, and each wiring is connected to a control board (not shown) via a flexible printed circuit board (not shown), and is connected to a terminal portion (not shown). The control board is provided with a control unit (not shown) including a computation unit, a storage unit, and the like. The control unit is configured to control an input signal to be input to the ultrasonic transmitting transducer 301 and to process an output signal output from the ultrasonic receiving transducer 302.

As described above, in the ultrasonic device 400 of the invention, compared to a sensor using a bulk piezoelectric ceramic or the like, it is possible to arrange the piezoelectric elements 300 formed by using MEMS technology at a narrow pitch, thereby providing high resolution, and the driving voltage is low. Accordingly, it is effective for size reduction, thinning and energy saving of the device and an apparatus mounting the device. In addition, since the production tolerance of the piezoelectric elements 300 is small, there is also an effect of improving the recognition accuracy.

Also, by reducing the thickness of the piezoelectric layer 70, it is effective to improve the displacement characteristics and to improve the ultrasonic wave transmission and reception efficiency.

Further, in this embodiment, the moisture resistant layer 200 is provided on the piezoelectric element 300. The moisture resistant layer 200 has a first moisture resistant layer 201 and a second moisture resistant layer 202 in the same manner as described in the aforementioned Embodiment 1. Since the materials of the moisture resistant layer 200 are the same as those of the above Embodiment 1, duplicate description thereof will be omitted. The moisture resistant layer 200 may be formed at least only on the side surface of the piezoelectric layer 70, and the moisture resistant layer 200 may be provided with an opening 206, in the same manner as described in Embodiment 1.

By providing a moisture resistant layer 200 as described above, it is possible to prevent the moisture resistant layer 200 from disturbing the high frequency driving of the ultrasonic transducers 301 and 302, and to suppress breakdown caused by moisture.

Other Embodiments

The embodiments of the invention have been described above, however, the invention is not limited thereto.

In Embodiment 1 and Embodiment 2 described above, the moisture resistant layer 200 having the first moisture resistant layer 201 and the second moisture resistant layer 202 has been exemplified, however, the invention is not particularly limited thereto, and the moisture resistant layer 200 may be formed by stacking three or more layers.

In Embodiment 1 described above, an ink jet recording head has been described as an example of a liquid ejecting head, however, the invention is broadly applied to a liquid ejecting head in general, and, of course, the invention is also applied to a liquid ejecting head ejecting liquid other than an ink. Examples of other liquid ejecting heads include: varieties of recording heads used in image recording apparatuses such as a printer; a color material ejecting head used for manufacturing color filters such as those for a liquid crystal display; an electrode material ejecting head used for forming an electrode such as that for an organic EL display or a field emission display (FED); and a bioorganic material ejecting head used for manufacturing, for example, a biochip.

Further, the invention is widely applied to MEMS devices, and can also be applied to piezoelectric devices used in MEMS devices other than a liquid ejecting head typified by an ink jet recording head, and an ultrasonic sensor. Example of such a MEMS device include: an ultrasonic motor; a piezoelectric transformer; an infrared sensor; a pressure sensor; a pyroelectric sensor; and a thermal sensor. The piezoelectric device of the invention is a piezoelectric device in which a piezoelectric layer 70, a first moisture resistant layer 201, and a second moisture resistant layer 202 are stacked in this order.

The entire disclosure of Japanese Patent Application No. 2016-039699, filed Mar. 2, 2016 is expressly incorporated by reference herein.

What is claimed is:

1. A piezoelectric device comprising:
a piezoelectric layer, a first moisture resistant layer, and a second moisture resistant layer stacked in this order, wherein
the first moisture resistant layer has a flexibility higher than a flexibility of the second moisture resistant layer,
the second moisture resistant layer has a moisture permeability lower than a moisture permeability of the first moisture resistant layer, and
the second moisture resistant layer is composed of chromium.

2. The piezoelectric device according to claim 1, wherein the first moisture resistant layer has a Young's modulus lower than a Young's modulus of the second moisture resistant layer.

3. The piezoelectric device according to claim 1, wherein the second moisture resistant layer is thinner than the first moisture resistant layer.

4. The piezoelectric device according to claim 1, wherein the first moisture resistant layer is composed of an organic compound.

5. The piezoelectric device according to claim 4, wherein the first moisture resistant layer is composed of polyimide.

6. A MEMS device comprising the piezoelectric device of claim 1.

7. A liquid ejecting head comprising the piezoelectric device of claim 1.

8. A liquid ejecting apparatus comprising the liquid ejecting head of claim 7.

9. A piezoelectric device comprising:
a piezoelectric layer, a first moisture resistant layer, and a second moisture resistant layer stacked in this order, wherein
the first moisture resistant layer has a flexibility higher than a flexibility of the second moisture resistant layer, and
the second moisture resistant layer contains chromium.

10. A MEMS device comprising the piezoelectric device of claim 9.

11. A liquid ejecting head comprising the piezoelectric device of claim 9.

12. A liquid ejecting apparatus comprising the liquid ejecting head of claim 11.

13. A piezoelectric device comprising:
a piezoelectric layer, a first moisture resistant layer, and a second moisture resistant layer stacked in this order on a substrate, and
wherein the first moisture resistant layer has a flexibility that is greater than a flexibility of the second moisture resistant layer, and
the first moisture resistant layer covers an entire surface of the substrate that is on a piezoelectric layer side of the substrate.

14. The piezoelectric device according to claim 13, wherein the first moisture resistant layer has a Young's modulus that is less than a Young's modulus of the second moisture resistant layer.

15. The piezoelectric device according to claim 13, wherein the second moisture resistant layer has a thickness that is less than that of the first moisture resistant layer.

16. The piezoelectric device according to claim 13, wherein the first moisture resistant layer is composed of an organic compound.

17. The piezoelectric device according to claim 16, wherein the first moisture resistant layer is composed of polymide.

18. A MEMS device comprising the piezoelectric device of claim 13.

19. A liquid ejecting head comprising the piezoelectric device of claim 13.

20. A liquid ejecting apparatus comprising the liquid ejecting head of claim 19.

* * * * *